(12) United States Patent
Lin et al.

(10) Patent No.: US 11,901,373 B2
(45) Date of Patent: Feb. 13, 2024

(54) ACTIVE ARRAY SUBSTRATE AND FABRICATING METHOD THEREOF

(71) Applicant: E Ink Holdings Inc., Hsinchu (TW)

(72) Inventors: Chien-Hung Lin, Hsinchu (TW); Ian French, Hsinchu (TW); Sheng-Long Lin, Hsinchu (TW); Xian-Teng Chung, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/861,216

(22) Filed: Apr. 29, 2020

(65) Prior Publication Data
US 2020/0381461 A1    Dec. 3, 2020

(30) Foreign Application Priority Data

May 28, 2019    (TW) .................................. 108118442

(51) Int. Cl.
*H01L 27/12*    (2006.01)
*H01L 29/786*    (2006.01)
(Continued)

(52) U.S. Cl.
CPC .... *H01L 27/1244* (2013.01); *G02F 1/136286* (2013.01); *G02F 1/167* (2013.01);
(Continued)

(58) Field of Classification Search
CPC ............... H01L 27/124; H01L 27/1214; G02F 1/134363; G09G 3/344
See application file for complete search history.

(56) References Cited

U.S. PATENT DOCUMENTS

| 8,643,577 B2 | 2/2014 | Chiou et al. |
| 9,093,537 B2 | 7/2015 | Lee et al. |

(Continued)

FOREIGN PATENT DOCUMENTS

| CN | 1637552 A | 7/2005 |
| CN | 1794078 A | 6/2006 |

(Continued)

OTHER PUBLICATIONS

Corresponding Taiwan office action dated Dec. 30, 2019.
The office action of corresponding CN application No. 201910449818.4 dated Nov. 23, 2023.

*Primary Examiner* — Samuel A Gebremariam
*Assistant Examiner* — Jonas T Beardsley
(74) *Attorney, Agent, or Firm* — CKC & Partners Co., LLC (57) ABSTRACT

An active array substrate includes a substrate and a plurality of pixel structure disposed on the substrate. Each of the pixel structure includes a scan line, a data line, and a pixel electrode. The scan line is disposed on the substrate and extending along a first direction. The data line is disposed on the substrate and extending along a second direction. The first direction crosses the second direction. The data line and the scan line define a pixel region and a first cutting clearance region. The pixel electrode is disposed on the substrate and includes a first portion and a second portion. The first portion is on the pixel region. The second portion is on the first cutting clearance region. A normal projection of the second portion onto the substrate does not overlap a normal projection of the data line onto the substrate.

8 Claims, 7 Drawing Sheets

(51) Int. Cl.
*G02F 1/167* (2019.01)
*G02F 1/1362* (2006.01)
*H01L 29/66* (2006.01)

(52) U.S. Cl.
CPC ...... *H01L 27/1225* (2013.01); *H01L 27/1259* (2013.01); *H01L 29/66969* (2013.01); *H01L 29/7869* (2013.01); *G02F 1/136295* (2021.01); *G02F 2201/121* (2013.01); *G02F 2201/123* (2013.01)

(56) References Cited

U.S. PATENT DOCUMENTS

| | | | | |
|---|---|---|---|---|
| 2006/0139504 | A1* | 6/2006 | Ahn | G02F 1/1362 |
| | | | | 349/42 |
| 2006/0146212 | A1* | 7/2006 | Ahn | G02F 1/134363 |
| | | | | 349/42 |
| 2007/0002249 | A1* | 1/2007 | Yoo | G02F 1/134363 |
| | | | | 349/141 |
| 2008/0123044 | A1* | 5/2008 | Oh | G02F 1/136227 |
| | | | | 349/187 |
| 2012/0092606 | A1 | 4/2012 | Tai et al. | |
| 2013/0155356 | A1* | 6/2013 | Jang | G02F 1/1343 |
| | | | | 438/30 |
| 2013/0161631 | A1 | 6/2013 | Lee et al. | |
| 2018/0040508 | A1 | 2/2018 | Que | |
| 2020/0034599 | A1* | 1/2020 | Chen | G06F 3/0421 |

FOREIGN PATENT DOCUMENTS

| | | |
|---|---|---|
| CN | 1797158 A | 7/2006 |
| CN | 1892394 A | 1/2007 |
| CN | 101685233 A | 3/2010 |
| CN | 103163703 A | 6/2013 |
| CN | 108594545 A | 9/2018 |
| CN | 104576698 B | 11/2018 |
| CN | 109407374 A | 3/2019 |
| JP | 2006251442 A | 9/2006 |
| KR | 20080048861 A | 6/2008 |
| TW | M540298 U | 4/2017 |
| WO | 2009001578 A1 | 12/2008 |

* cited by examiner

ACTIVE ARRAY SUBSTRATE AND FABRICATING METHOD THEREOF

CROSS-REFERENCE TO RELATED APPLICATION

This application claims priority to Taiwan Application Serial Number 108118442, filed May 28, 2019, which is herein incorporated by reference in its entirety.

BACKGROUND

Field of Invention

The present invention relates to an active array substrate and fabrication method thereof.

Description of Related Art

In recent years, with the improvement of the technology, the electronic devices such as mobile phones, tablet computers or eBooks are widely applied in daily life. One common electrophoretic display device is formed by assembling an electrophoretic display film and an active array substrate.

However, formation of the electrophoretic display devices with different sizes using current technology should be custom designed and thus these are expensive. A small sized electrophoretic display device formed by cutting an electrophoretic display device may cause a top electrode and a bottom electrode on the cutting region have short circuit and cause issues of reduced yield.

SUMMARY

The embodiments of the present disclosure provide an active array substrate. The active array substrate includes a substrate and a plurality of pixel structures disposed on the substrate. Each pixel structure includes a data line and a scan line. By defining a first cutting clearance region and a second cutting clearance region using the data line and the scan line and allowing the position of cutting be on the first cutting clearance region and the second cutting clearance region, depending on a desired size of the display device, a display region of the active array substrate is cut along a first direction and along a second direction to form the active array substrate with a desired range. Therefore, the display device has achieved flexibility in size without using an additional mask and thus enables modulation of production. Therefore, an improved flexibility of processes is achieved and manufacturing costs are reduced. Moreover, by allowing normal projections of the conductors of different layers on the first cutting clearance region to not overlap with each other during cutting on the display region (e.g., the first cutting clearance region and the second cutting clearance region), a risk of short circuits between the conductors of different layers on an edge of the active array substrate may be avoided. Therefore, product yield and reliability may be significantly improved.

In some embodiments, an active array substrate includes a substrate and a plurality of pixel structure disposed on the substrate. Each of the pixel structure includes a scan line, a data line, and a pixel electrode. The scan line is disposed on the substrate and extends along a first direction. The data line is disposed on the substrate and extending along a second direction. The first direction crosses the second direction. The data line and the scan line define a pixel region and a first cutting clearance region. The pixel electrode is disposed on the substrate and includes a first portion and a second portion. The first portion is on the pixel region. The second portion is on the first cutting clearance region. A normal projection of the second portion onto the substrate does not overlap a normal projection of the data line onto the substrate.

In some embodiments, a method of fabricating an active array substrate includes forming a gate electrode over a substrate; forming a first insulator layer over the gate electrode; forming a channel layer over the gate electrode; forming a source region, a drain region, a common electrode, and a data line over the substrate, in which the source and the drain are connected to the channel layer; forming a second insulator layer over the source region, the drain region, the common electrode, and the data line, an active device is defined by including the gate electrode, the channel layer, the source region, and the drain region; and forming a pixel electrode over the second insulator layer, in which the pixel electrode includes a first portion and a second portion connected to the first portion, the first portion is on the active device, the second portion and the data line are spaced apart by a first distance, and the second portion and the common electrode are spaced apart by a second distance.

It is to be understood that both the foregoing general description and the following detailed description are by example, and is intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
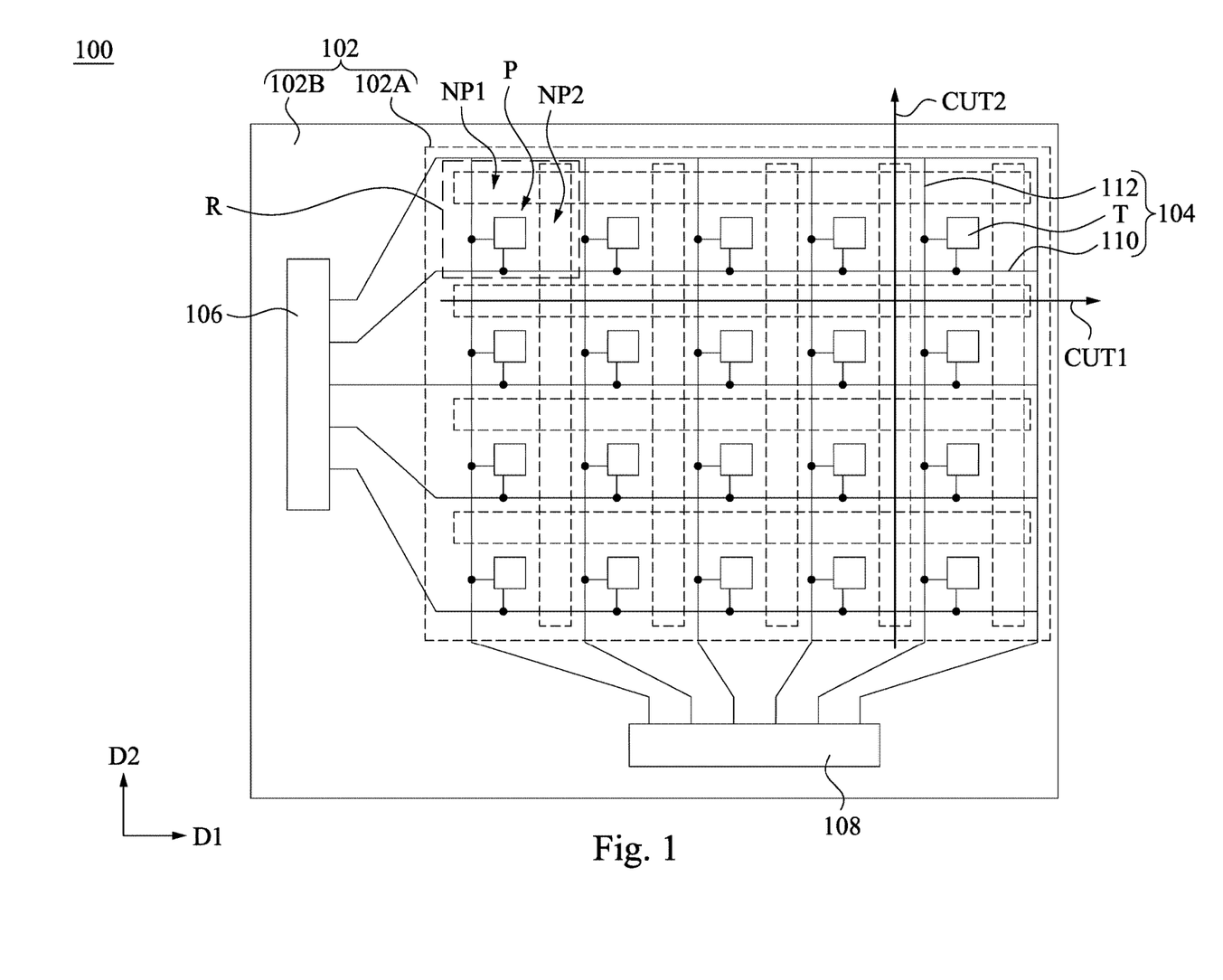
FIG. 1 is a top view of an active array substrate in accordance with some embodiments of the present disclosure.
Figure 2:
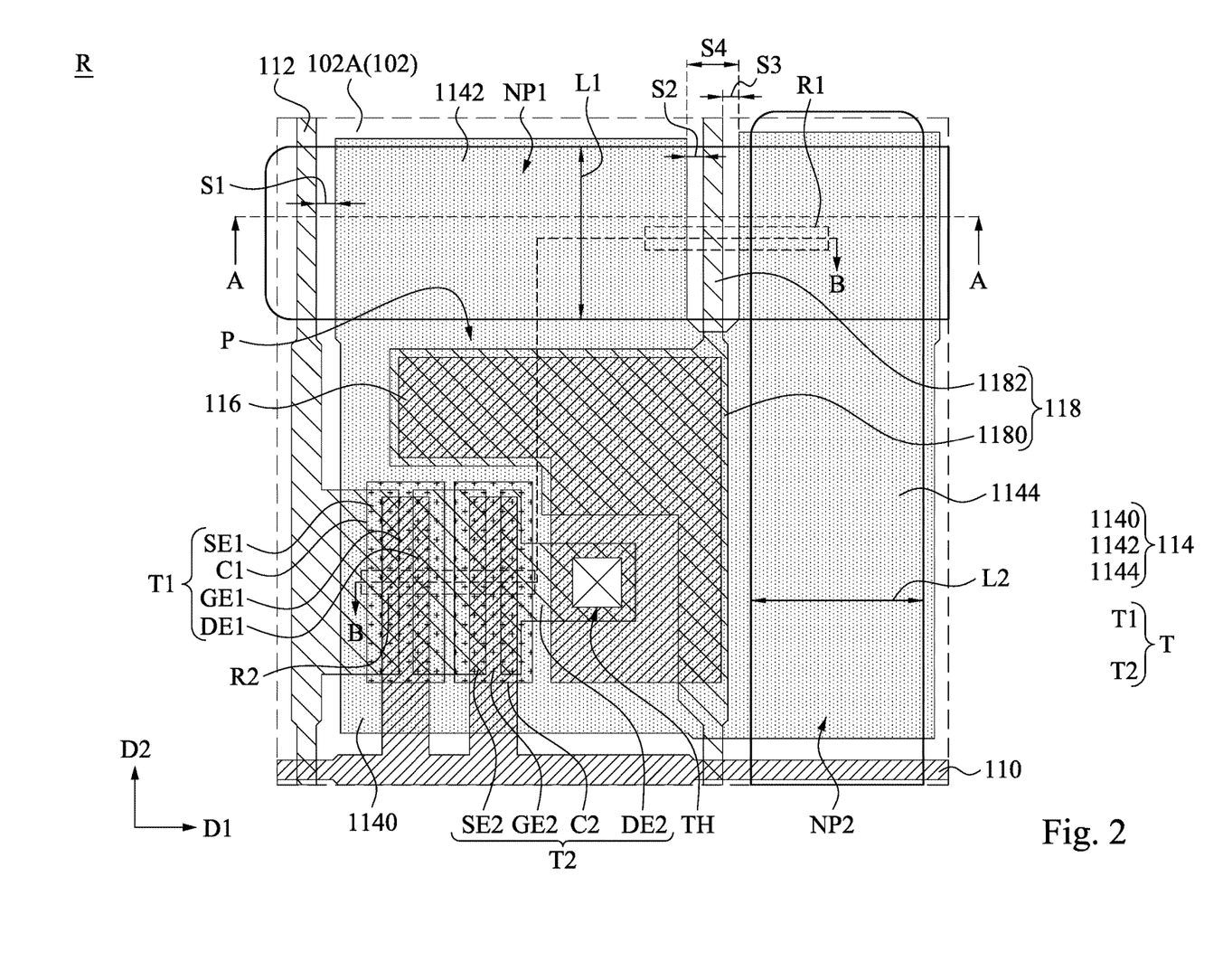
FIG. 2 is an enlarged view of the region R in FIG. 1.

FIG. 1 is a top view of an active array substrate 100 in accordance with some embodiments of the present disclosure. FIG. 2 is an enlarged view of the region R in FIG. 1. Reference is made to FIGS. 1 and 2. The active array substrate 100 includes a substrate 102 and a plurality of pixel structures 104, a scan driving circuit 106, and a data driving circuit 108 over the substrate 102. The substrate 102 includes a viewable region 102A and a non-viewable region 102B. The pixel structure 104 is on the viewable region 102A. The scan driving circuit 106 and the data driving circuit 108 are on the non-viewable region 102B. The pixel structures 104 are disposed in an array over the substrate 102 and include a plurality of data lines 112 and a plurality of scan lines 110 over the substrate 102. The scan lines 110 and the data lines 112 are electrically isolated and cross with each other. For example, the scan lines 110 extend along a first direction D1. The data lines 112 extend along a second direction D2. In some embodiments, the first direction D1 crosses the second direction D2. For example, the first direction D1 may be, but is not limited to, perpendicular to the second direction D2. The scan lines 110 and the data lines 112 may include metal such as, but is not limited to, Al, W, Mo, Ta, Cr, or alloys thereof. The pixel structures 104 may be applied in a display device, for example, an electrophoretic display device (see FIG. 5).

The data lines 112 and the scan lines 110 define a pixel region P and a first cutting clearance region NP1. The first cutting clearance region NP1 extends along the first direction D1. The pixel structure 104 further includes a plurality of active devices T. The active devices T are on the pixel region P. The active devices T are electrically connected to the corresponding scan lines 110 and data lines 112. The scan driving circuit 106 and the data driving circuit 108 are configured to input corresponding signals to the scan lines 110 and the data lines 112 so as to allow the pixel structures 104 to display.

In some embodiments, the active device T includes an active device T1 and an active device T2. The active device T1 includes a gate GE1, a channel layer C1, a source region SE1, and a drain region DE1. The active device T2 includes a gate GE2, a channel layer C2, a source region SE2, and a drain region DE2. The channel layer C1 is over the gate GE1. The channel layer C2 is over the gate GE2. The source region SE1 and the drain region DE1 are connected to the channel layer C1. The source region SE2 and the drain region DE2 are connected to the channel layer C2. The active devices T1, T2 are connected to the same scan line 110 and the same data line 112. In particular, as shown in FIG. 2, the source region SE1 of the active device T1 is connected to the data line 112 so as to transport data signals. The drain region DE1 of the active device T1 is connected to the source region SE2 of the active device T2. The scan line 110 is electrically connected to the gate GE1 and the gate GE2 so as to transport scan signals. The gates GE1, GE2, the source regions SE1, SE2, and the drain regions DE1, DE2 include metal, for example, but is not limited to, Al, W, Mo, Ta, Cr, or alloys thereof. Materials of the channel layers C1, C2 may be, for example, indium-gallium-zinc Oxide (IGZO), indium-zinc oxide (IZO), gallium-zinc oxide (GZO), aluminum-zinc oxide (AZO), zinc-tin oxide (ZTO) or indium-tin oxide (ITO), the like, or combinations thereof.

The pixel structure 104 further includes a pixel electrode 114. The pixel electrode 114 is disposed on the substrate 102 and electrically connected to the active devices T1, T2. In particular, the pixel electrode 114 is in contact with the drain region DE2 through a through hole TH. In some embodiments, the pixel electrode 114 includes a first portion 1140 and a second portion 1142 connected to the first portion 1140. The first portion 1140 is on the pixel region P and is on the active device T. In other words, a normal projection of the first portion 1140 onto the substrate 102 overlaps normal projections of the active devices T1, T2 onto the substrate 102. The second portion 1142 is on the first cutting clearance region NP1. A normal projection of the second portion 1142 onto the substrate 102 does not overlap normal projections of the active devices T1, T2 onto the substrate 102. The first cutting clearance region NP1 has a length L1 along the second direction D2 long enough to provide high yield rate of cutting. The length L2 along the second direction D2 of the first cutting clearance region NP1 may be substantially the same as a length along the second direction D2 of the second portion 1142 of the pixel electrode 114 on the first cutting clearance region NP1. In some embodiments, the length L1 along the second direction D2 of the first cutting clearance region NP1 is in a range from about 10 μm to about 200 μm. In some other embodiments, the length L1 is in a range from about 80 μm to about 100 μm. In other words, the length along the second direction of the second portion 1142 of the pixel electrode 114 is in a range from about 10 μm to about 200 μm. In some other embodiments, the length along the second direction D2 of the second portion 1142 of the pixel electrode 114 is in a range from about 80 μm to about 100 μm. By designing the first cutting clearance region NP1 defined by the data line 112 and the scan line 110, depending on a desired size of the display device, the viewable region 102A of the active array substrate 100 is cut along first direction D1 (e.g., cut along the first cutting line CUT1) so as to obtain the active array substrate 100 with a selected length along the second direction D2. For example, the length along the second direction D2 of the active array substrate 100 may be shortened. Therefore, flexibility for the size of the display device is achieved. The active array substrates 100 having different sizes may be formed without an additional mask and thus enables modulation of production. Therefore, an improved flexibility of processes is achieved and manufacturing costs are reduced.

In some embodiments, a method of cutting the active array substrate 100 may include using, for example, but is not limited to, a laser beam, a diamond bar, and a breaker bar to form predetermined crack on a surface of the substrate 102. In some embodiments, a cut line width of the laser beam is in a range from about 10 nm to about 80 nm.

In some embodiments, the substrate 102 may be glass or plastic. In order to support the active array substrate 100 during cutting and in order to obtain the active array substrate 100 with flexibility after cutting, in some embodiments, the substrate 102 of the active array substrate 100 includes a flexible substrate and a support substrate. The flexible substrate is disposed between the pixel structures 104 and the support substrate. In particular, a material of the flexible substrate may be polyimide (PI), polycarbonate (PC), polyethersulfone (PES), polyacrylate (PA), polynorbornene (PNB), polyethylene terephthalate (PET), polyetheretherketone (PEEK), polyethylene naphthalate (PEN), or polyetherimide (PEI), the like, or combinations thereof. After cutting the active array substrate 100, the flexible substrate is separated from the support substrate selectively and the substrate 102 is merely formed of the flexible substrate herein.

The pixel structure 104 further includes an auxiliary electrode 116 and a common electrode 118. The common electrode 118 is between the auxiliary electrode 116 and the pixel electrode 114. The auxiliary electrode 116 may be electrically connected to the pixel electrode 114. The pixel electrode 114 and the auxiliary electrode 116 are electrically isolated to the common electrode 118. In some embodiments, an insulator layer (e.g., a second insulator layer 122 and a buffer layer 124 in FIG. 3) is between the pixel electrode 114 and the common electrode 118. An insulator layer (e.g., a first insulator layer 120 in FIG. 3) is between the common electrode 118 and the auxiliary electrode 116 as well. For example, a common voltage ($V_{com}$) is applied on the common electrode 118 to allow the pixel electrode 114 and the auxiliary electrode 116 electrically coupled to the common electrode 118 so as to form a desired storage capacitance. The common electrode 118 and the auxiliary electrode 116 may include metal, for example, but is not limited to, Al, W, Mo, Ta, Cr, or alloys thereof.

In some embodiments, the scan lines 110, the gates GE1, GE2 and the auxiliary electrode 116 are the same layer. For example, the scan lines 110, the gates GE1, GE2 and the auxiliary electrode 116 may be formed by patterning a first conductive layer and include the same material and the same thickness. The data lines 112, the source regions SE1, SE2, the drain regions DE1, DE2, and the common electrode 118 are the same layer. For example, the data lines 112, the source regions SE1, SE2, the drain regions DE1, DE2, and the common electrode 118 may be formed by patterning a second conductive layer and include the same material and the same thickness. The pixel electrode 114 is formed by patterning a third conductive layer. The first conductive layer, the second conductive layer, and the third conductive layer are different layers. It should be noted that, the first, the second, the third conductive layers are used to distinguish layers formed by different processes and are not to limit the sequence of the formation of the layers. In actual processes, the first conductive layer may be formed before or after the second conductive layer.

Figure 3:
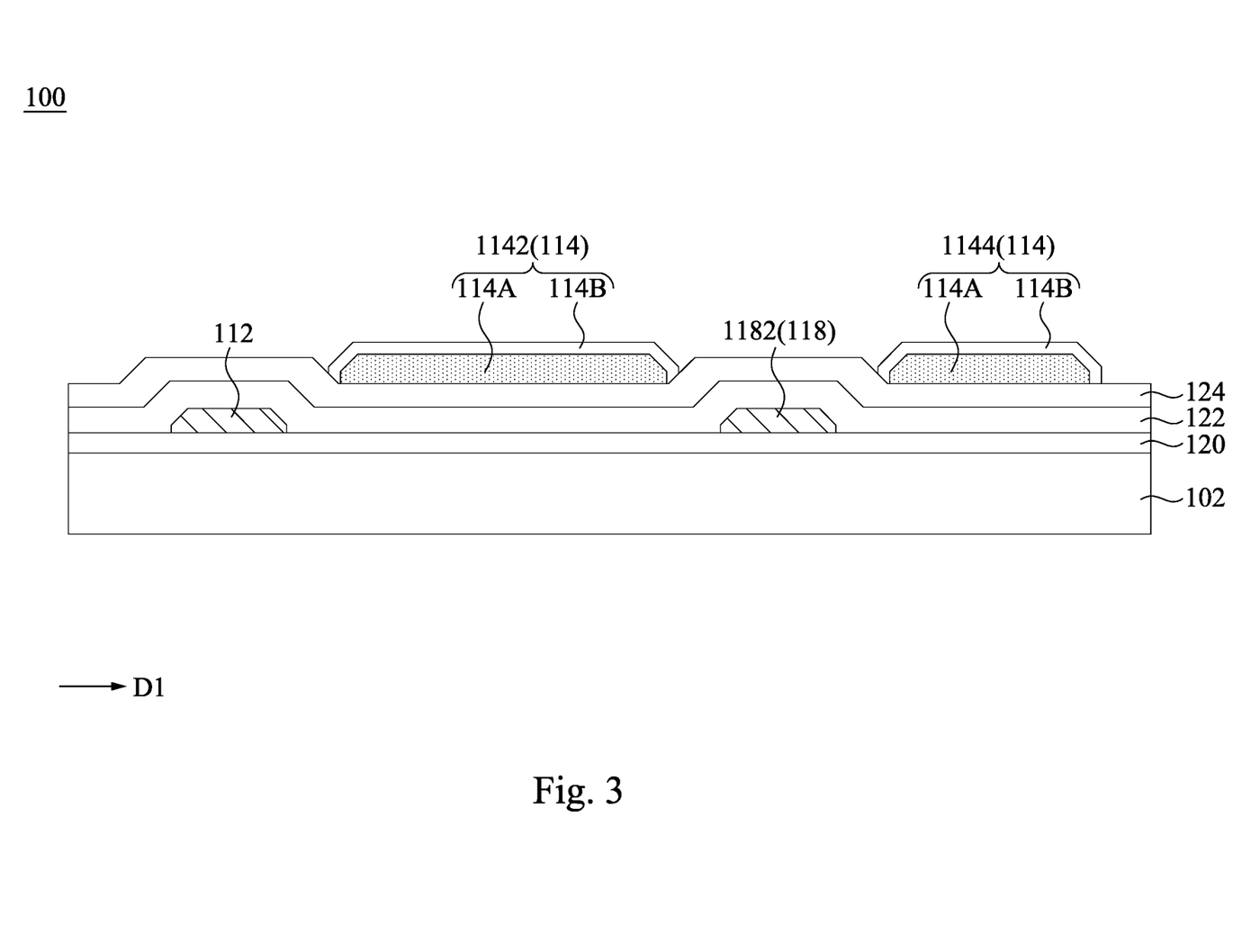
FIG. 3 is a cross-sectional view of FIG. 1 taken along line A-A.

FIG. 3 is a cross-sectional view of FIG. 1 taken along line A-A. Reference is made to FIGS. 2 and 3. A normal projection of the second portion 1142 of the pixel electrode 114 onto the substrate 102 does not overlap a normal projection of the data line 112 onto the substrate 102. For example, the second portion 1142 of the pixel electrode 114 and the data line 112 are spaced apart by a first distance S1 along the first direction D1. In some embodiments, the first distance S1 is in a range from about 3 μm to about 7 μm. Therefore, since the position of cutting is on the first cutting clearance region NP1, during cutting the viewable region 102A (e.g., the first cutting clearance region NP1) of the active array substrate 100, a risk of short circuits between the conductors of different layers on an edge of the active array substrate 100 may be avoided. Therefore, product yield and reliability is improved.

The pixel structure 104 further includes a first insulator layer 120 between the common electrode 118 and the substrate 102. The pixel structure 104 further includes a second insulator layer 122 and a buffer layer 124 over the second insulator layer 122. In some embodiments, two opposite surfaces of the common electrode 118 are in contact with the first insulator layer 120 and the second insulator layer 122, respectively. The second insulator layer 122 and the buffer layer 124 are between the pixel electrode 114 and the common electrode 118. In some embodiments, the pixel electrode 114 is on the buffer layer 124 and is in contact with the buffer layer 124. The first insulator layer 120, the second insulator layer 122 and the buffer layer 124 may include organic insulator materials, for example, parylene, hexamethyldisiloxane (HMDSO), the like, or combinations thereof.

In some embodiments, the common electrode 118 includes a first portion 1180 and a second portion 1182 connected to the first portion 1180. The first portion 1180 and the second portion 1182 of the common electrode 118 are on the pixel region P and the first cutting clearance region NP1, respectively. In some embodiments, an area of a normal projection of the second portion 1182 of the common electrode 118 onto the substrate 102 is substantially less than an area of a normal projection of the data line 112 onto the substrate 102. A normal projection of the second portion 1182 of the common electrode 118 onto the substrate 102 does not overlap a normal projection of the second portion 1142 of the pixel electrode 114 onto the substrate 102. In particular, the second portion 1182 of the common electrode 118 and the second portion 1142 of the pixel electrode 114 are spaced apart by a second distance S2 along the first direction D1. In some embodiments, the second distance S2 is in a range from about 3 μm to about 7 μm. Therefore, since the position of cutting is on the first cutting clearance region NP1, during cutting the viewable region 102A (e.g., the first cutting clearance region NP1) of the active array substrate 100, a risk of short circuits between the conductors of different layers (e.g., the common electrode 118 and the pixel electrode 114) on an edge of the active array substrate 100 may be avoided. Therefore, product yield and reliability is improved.

The data line 112 and the scan line 110 further define a second cutting clearance region NP2. The second cutting clearance region NP2 extends along the second direction D2 and crosses the first cutting clearance region NP1. In some embodiments, the second cutting clearance region NP2 is substantially perpendicular to the first cutting clearance region NP1. The pixel region P is between the data line 112 and the second cutting clearance region NP2. The pixel electrode 114 further includes a third portion 1144 on the second cutting clearance region NP2. A normal projection of the third portion 1144 on the substrate 102 does not overlap normal projections of the active devices T1, T2 onto the substrate 102. The second cutting clearance region NP2 has a length L2 along the second direction D2 which is long enough to provide high yield rate of cutting. The length L2 along the first direction D1 of the second cutting clearance region NP2 is substantially the same as the length along the first direction D1 of the third portion 1144 of the pixel electrode 114 on the second cutting clearance region NP2. In some embodiments, the length D2 along the first direction D1 of the second cutting clearance region NP2 is in a range from about 10 μm to about 200 μm. In some other embodiments, the length L2 is in a range from about 80 μm to about 100 μm. In other words, the length of the third portion 1144 of the pixel electrode 114 along the first direction D1 is in a range from about 10 μm to about 200 μm. In some other embodiments, the length along the first direction D1 of the third portion 1144 of the pixel electrode 114 is in a range from about 80 μm to about 100 μm. By designing the second cutting clearance region NP2 defined by the data line 112 and the scan line 110, depending on a desired size of the display device, the viewable region 102A of the active array substrate 100 is cut along the second direction D2 (e.g., cut along the second cutting line CUT2) so as to obtain the active array substrate 100 with a selected length along the first direction D1. For example, the length along the first direction D1 of the active array substrate 100 may be shortened. Therefore, flexibility for the size of the display device is achieved. The active array substrates 100 having different sizes may be formed without an additional mask and thus enables modulation of production. Therefore, an improved flexibility of processes is achieved and manufacturing costs are reduced.

A normal projection of the third portion 1144 of the pixel electrode 114 onto the substrate 102 does not overlap a normal projection of the common electrode 118 onto the substrate 102. In particular, the third portion 1144 of the pixel electrode 114 and the second portion 1182 of the common electrode 118 are spaced apart by a third distance S3 along the first direction D1. In some embodiments, the third distance S3 is in a range from about 3 μm to about 7

µm. The second portion 1142 of the pixel electrode 114 and the third portion 1144 of the pixel electrode 114 are spaced apart by a fourth distance S4 along the first direction D1. In some embodiments, the fourth distance S4 is substantially greater than about 10 µm. Therefore, since the position of cutting is on the second cutting clearance region NP2, during cutting the viewable region 102A of the active array substrate 100, a risk of short circuits between the conductors of different layers (e.g., the common electrode 118 and the pixel electrode 114) on an edge of the active array substrate 100 may be avoided. Therefore, a product yield and reliability is improved.

In some embodiments, the pixel electrode 114 includes a metal layer, a transparent conductive layer, the like, or combinations thereof. For example, the pixel electrode 114 is a double-layered structure. In particular, the pixel electrode 114 includes a metal layer 114A and a transparent conductive layer 114B over the metal layer 114A. In some embodiments, the metal layer 114A includes Al, W, Mo, Ta, Cr, or alloys thereof. The transparent conductive layer 114B may include, but is not limited to, indium-tin oxide (ITO), indium-zinc oxide (IZO), and aluminum-zinc oxide (AZO). The transparent conductive layer 114B can protect the metal layer 114A from being oxidization or corrosion. The reliability of the pixel electrode 114 is thus improved.

Figure 4A:
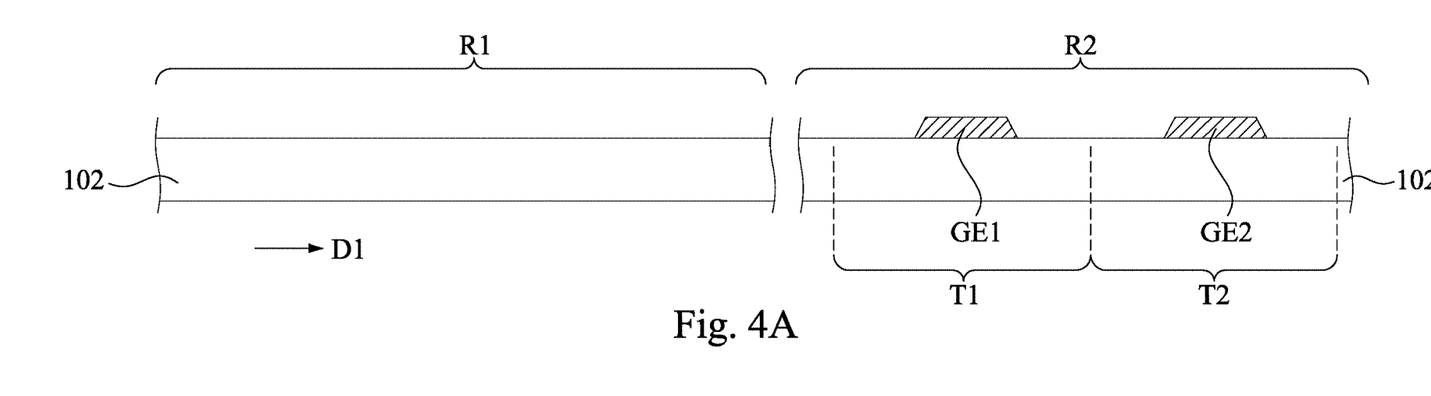
FIGS. 4A-4C are cross-sectional views of fabricating a first sub region and a second sub region of FIG. 2 taken along line B-B.
Figure 4B:
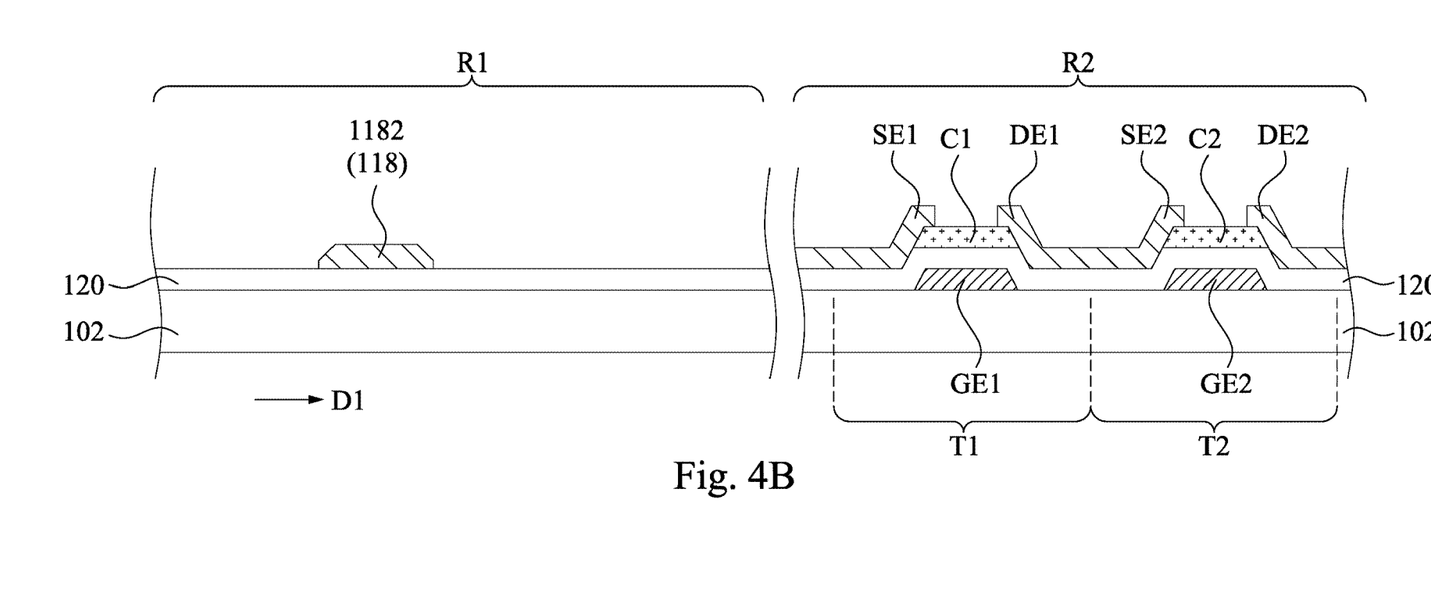

FIGS. 4A-4C are cross-sectional views of fabricating a first sub region R1 and a second sub region R2 of FIG. 2 taken along line B-B. Reference is made to FIG. 4A. The substrate 102 is provided. A first conductive layer (not shown) is formed on the substrate 102. Then, the first conductive layer is patterned to form the gate GE1 of the active device T1, the gate GE2 of the active device T2, the auxiliary electrode 116 (see FIG. 2) and the scan line (see FIG. 2). Reference is made to FIG. 4B. A first insulator layer 120 is formed on the substrate 102 to cover the gates GE1, GE2, the auxiliary electrode 116 (see FIG. 2) and the scan line 110 (see FIG. 2). Afterward, channel layers C1, C2 are formed on the first insulator layer 120 on the second sub region R2, where the transistors (e.g., active devices T1, T2) are to be formed. The channel layers C1, C2 are over the gates GE1, GE2. The formation method of the channel layers C1, C2 includes, for example, forming a metal oxide semiconductor material and then patterning the metal oxide semiconductor material to remove metal oxide semiconductor material not above the gates GE1, GE2. Then, a second conductive layer (not shown) is formed over the first insulator layer 120 and the channel layers C1,C2 and then patterned to form the source regions SE1, SE2, the drain regions DE1, DE2, the common electrode 118 (e.g., the second portion 1182), and the data line 112 (see FIG. 2).

Figure 4C:
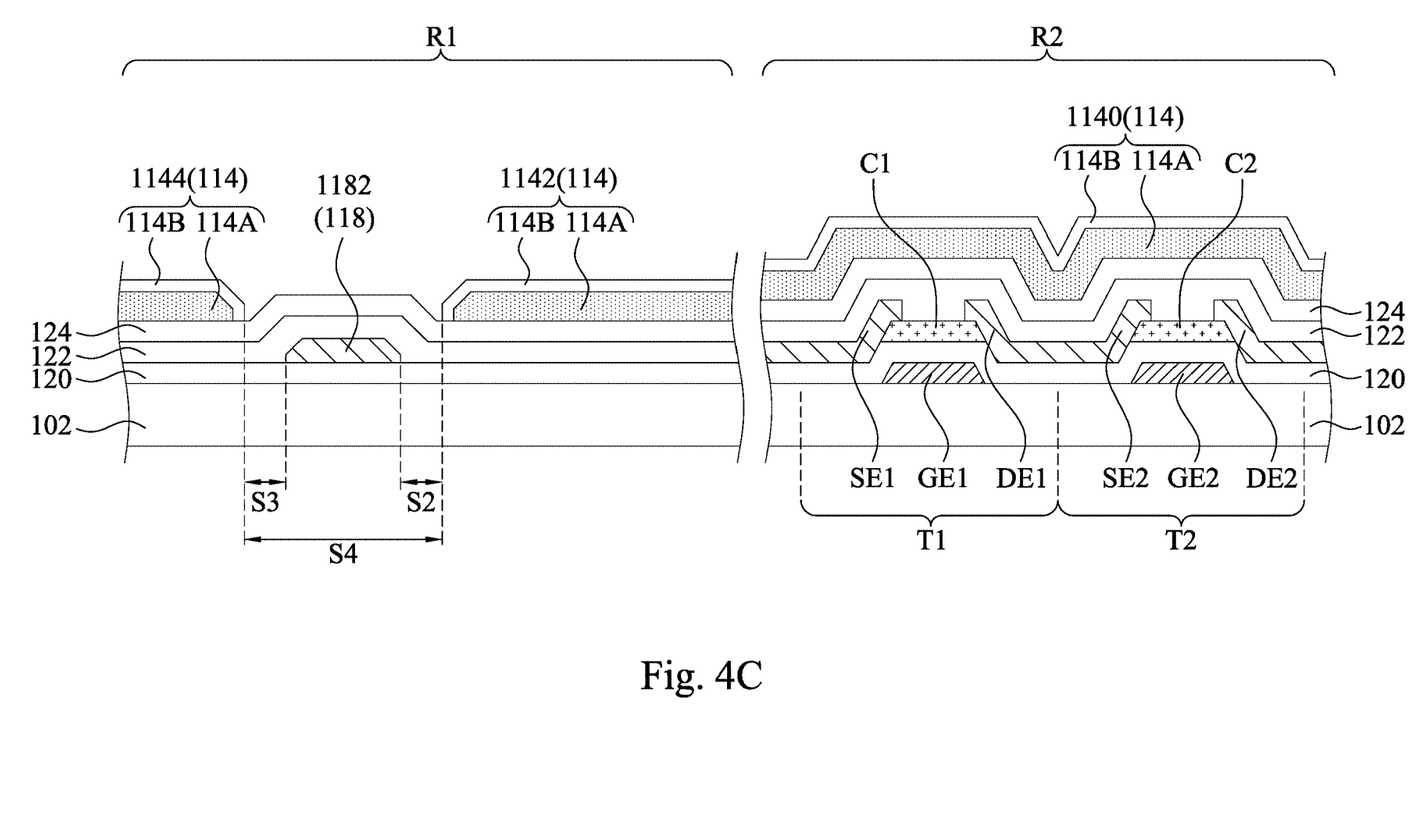

Reference is made to FIG. 4C. A doubled layer including the second insulator layer 122 and the buffer layer 124 are sequentially formed on the source regions SE1, SE2, the drain regions DE1, DE2, the common electrode 118 (e.g., the second portion 1182), and the data line 112. Then, a third conductive layer (not shown) is formed on the buffer layer 124 and then patterned to form the pixel electrode 114, which includes the metal layer 114A and the transparent conductive layer 114B over the metal layer 114A. As discussed above, the pixel electrode 114 includes the first portion 1140, the second portion 1142 and the third portion 1144. The details with respect to these portions will not be repeated herein. The materials of the second insulator layer 122, the buffer layer 124, and the pixel electrode 114 are as discussed above, and thus not repeated herein. Formation methods of each layers of the active array substrate 100 may include forming a material layer depending on the desired material over the substrate and patterning the material layer depending on the desired pattern to complete the desired elements. Formation methods of the layers include deposition, spin coating, or the like. The deposition includes chemical vapor deposition or other thin film deposition techniques. The patterning methods include lithography, laser, or the like. In some other embodiments, the formation methods of the elements may be printing.

Figure 5:
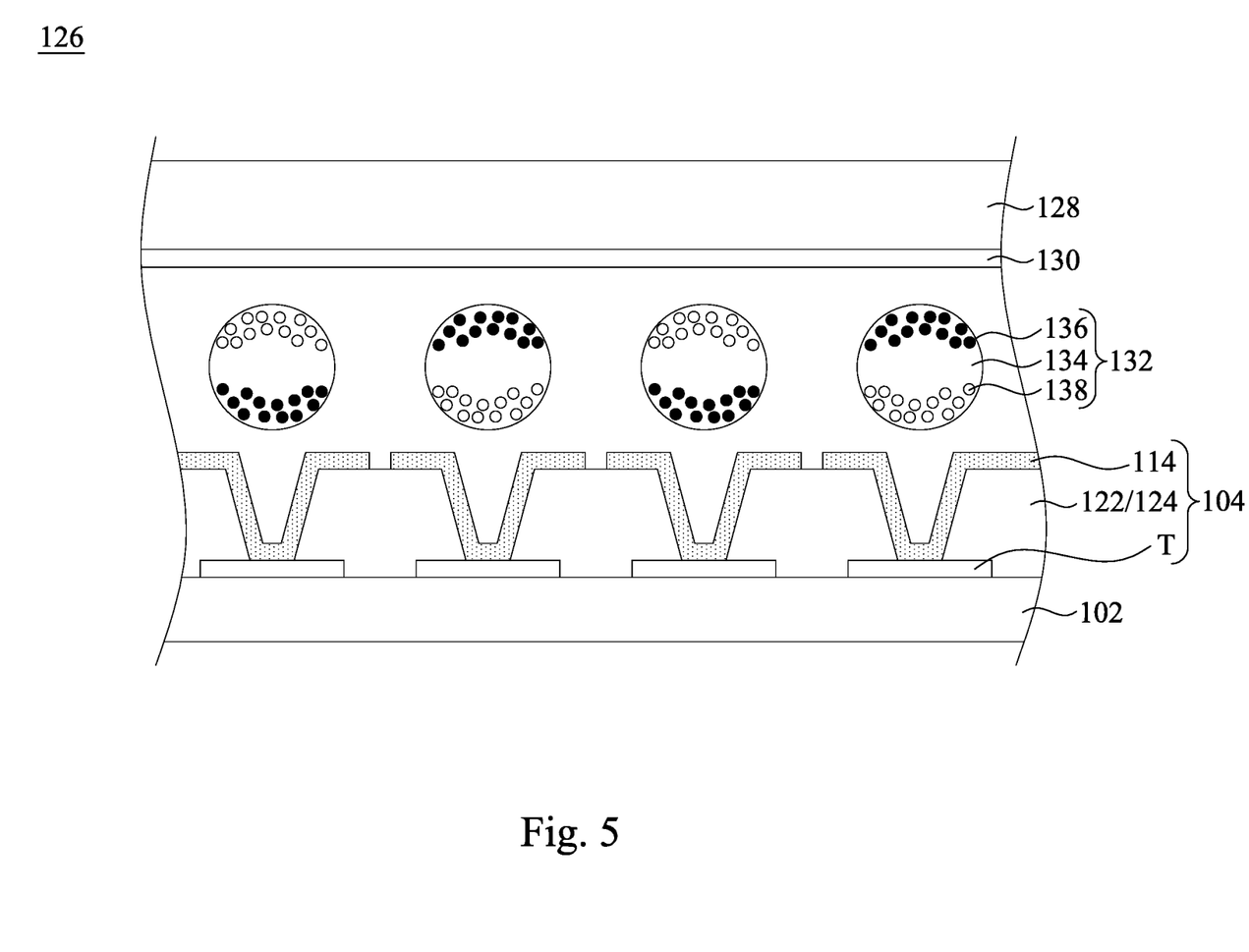
FIG. 5 is a cross-section view of an electrophoretic display device applying pixel structures of the present disclosure.

The pixel structure 104 of the present disclosure may be applied to the display device, for example, the electrophoretic display device 126. FIG. 5 is a cross-section view of the electrophoretic display device 126 using the pixel structure 104 of the present disclosure. Reference is made to FIG. 5. The electrophoretic display device 126 includes a transparent substrate 128, a transparent electrode layer 130, microcapsules 132, and the pixel structure 104 of the present embodiment. For brevity, only the active device T (includes active devices T1, T2), the pixel electrode 114, the second insulator layer 122, and the buffer layer 124 are illustrated. The transparent substrate 128 is disposed over the pixel structure 104. The transparent substrate 128 is disposed over the pixel structure 104. The transparent electrode layer 130 is disposed under the transparent substrate 128. The transparent electrode layer 130 may include, but is not limited to, indium-tin oxide (ITO), indium-zinc oxide (IZO), and aluminum-zinc oxide (AZO).

The microcapsules 132 are between the transparent electrode layer 130 and the pixel structure 104 and are used as a display medium. Each microcapsule 132 includes an electrophoretic fluid 134, black charged particles 136 and white charged particles 138 distributed in the electrophoretic fluid 134. By applying a dc voltage or an ac voltage, the black charged particles 136 and the white charged particles 138 are driven to move. Therefore, the pixel structure 104 can display black, white, or different grey levels. Furthermore, the transparent substrate 128 and the substrate 102 may include flexible materials, for example, plastic. The electrophoretic display device 126 may be an e-paper or an e-book.

The charged particles in the microcapsules 132 are not limited to be black and white. In other embodiments, the charged particles in the electrophoretic fluid 134 may have other colors, for example, but is not limited to, red, green, or blue. Therefore, the electrophoretic display device 126 may form a full color image. The electrophoretic display device 126 may include, but is not limited to, a color filter layer.

The embodiments of the present disclosure provide the active array substrate 100. The active array substrate 100 includes a plurality of pixel structures 104 disposed on the substrate 102. By defining the first cutting clearance region NP1 and the second cutting clearance region NP2 using the data line 112 and the scan line 110 and allowing the position of cutting be on the first cutting clearance region NP1 and the second cutting clearance region NP2, depending on the size of the display device, the viewable region 102A of the active array substrate 100 is cut along the first direction (e.g., along the first cutting line CUT1) and along the second direction (e.g., along the second cutting line CUT2) to cut the active array substrate 100 with desired range. Therefore, the display device has achieved flexibility of size without using an additional mask and thus enables modulation of production. Therefore, an improved flexibility of processes is achieved and manufacturing costs are reduced. Moreover, by allowing the normal projections of the conductors of different layers on the first cutting clearance region NP1 do not overlap with each other, during cutting on the viewable region 102A (e.g., the first cutting clearance region NP1 and the second cutting clearance region NP2), a risk of short circuits between the conductors of different layers on an edge of the active array substrate 100 may be avoided. Therefore, product yield and reliability is improved.

Figure 6:
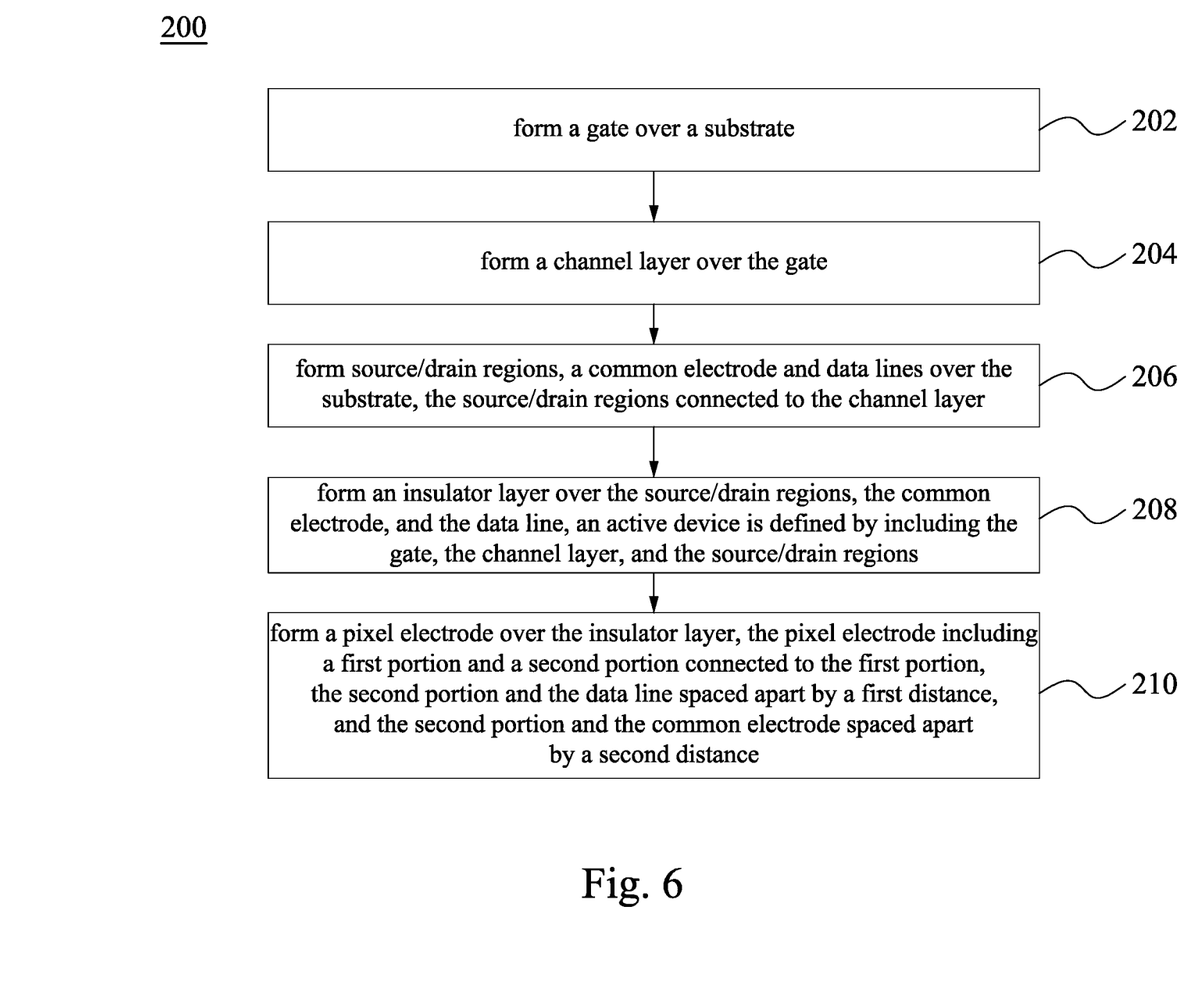
FIG. 6 is a flow chart of a fabrication method of the active array substrate in accordance with some embodiments of the present disclosure.

FIG. 6 illustrates a flowchart 200 of the manufacturing method of the active array substrate 100 in accordance with the present disclosure. Reference is made to FIGS. 1-6. The flowchart 200 can be applied to the active array substrate 100 at least in FIGS. 1-4C. At step 202, the gates GE1, GE2, the auxiliary electrode 116, and the scan lines 110 (not shown) are formed on the substrate 102. At step 204, the first insulator layer 120, the channel layers C1, C2 are formed on the substrate 102. The source regions SE1, SE2, the drain regions DE1, DE2, the common electrode 118 (e.g., the first portion 118O), and the data line 112 are formed on the first insulator layer 120 and the channel layers C1, C2. At step 206, a doubled layer including the second insulator layer 122 and the buffer layer 124 and the pixel electrode 114 are sequentially formed on the source region SE1, SE2, drain regions DE1, DE2, the common electrode 118 (e.g., the first portion 118O) and the data line 112. At step 208, the first cutting clearance region NP1 of the active array substrate 100 is cut along the first direction D1. At step 210, the second cutting clearance region NP2 of the active array substrate 100 is cut along the second direction D2. Moreover, the corresponding embodiments of the active array substrate 100 and the elements can be regard to the embodiments in FIGS. 1-4C and are not repeated herein.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electrophoretic display device, comprising:
   an active array substrate, comprising:
   a first substrate; and
   a plurality of pixel structures disposed on the first substrate, the pixel structures being arranged in rows and columns, each of the pixel structures comprising:
   a scan line disposed on the first substrate and extending along a first direction;
   a data line disposed on the first substrate and extending along a second direction, the first direction crossing the second direction, the data line and the scan line defining a pixel region, a first cutting clearance region, and a second cutting clearance region, the first cutting clearance regions of first ones of the pixel structures in a same row being connected to form a first continuous cutting clearance region spanning the first ones of the pixel structures in the same row, the second cutting clearance regions of second ones of the pixel structures in a same column being connected to form a second continuous cutting clearance region spanning the second ones of the pixel structures in the same column, and the first continuous cutting clearance region being perpendicular to the second continuous cutting clearance region;
   a pixel electrode disposed on the first substrate and including a first portion and a second portion, wherein the first portion is on the pixel region, the second portion is on the first cutting clearance region, and a normal projection of the second portion onto a top surface of the first substrate does not overlap a normal projection of the data line onto the top surface of the first substrate;
   a common electrode having a main portion and an elongated portion extending along the second direction along which the data line extends, wherein when viewed in a cross section cutting through the second portion of the pixel electrode, the elongated portion of the common electrode and the data line, the common electrode non-overlaps the pixel electrode, and when viewed in a top view, the second portion of the pixel electrode has a terminated edge non-overlapping the common electrode, the common electrode is covered by the pixel electrode in the pixel region;
   at least one insulator layer disposed between the common electrode and the pixel electrode, wherein the common electrode, the at least one insulator layer and the pixel electrode are stacked from bottom to top in sequence; and
   a transistor electrically connected to the scan line and the data line, wherein the transistor is at a region non-overlapping the first continuous cutting clearance region and the second continuous cutting clearance region;
   a transparent electrode layer over the plurality of pixel structures;
   microcapsules between the transparent electrode layer and the plurality of pixel structures; and
   a second substrate over the transparent electrode layer, wherein the second substrate is a transparent.

2. The electrophoretic display device of claim 1, wherein a length along the second direction of the second portion of the pixel electrode is in a range from about 10 μm to about 200 μm.

3. The electrophoretic display device of claim 1, wherein a normal projection of the first portion of the pixel electrode onto the top surface of the first substrate does not overlap a normal projection of the data line onto the top surface of the first substrate.

4. The electrophoretic display device of claim 1, wherein the main portion and the elongated portion of the common electrode are on the pixel region and the first cutting clearance region, respectively, a normal projection of the elongated portion of the common electrode onto the top surface of the first substrate non-overlaps a normal projection of the second portion of the pixel electrode onto the top surface of the first substrate.

5. The electrophoretic display device of claim 4, wherein the elongated portion of the common electrode and the second portion of the pixel electrode are spaced apart by a distance along the first direction.

6. The electrophoretic display device of claim 4, wherein a distance along the first direction between the elongated portion of the common electrode and the second portion of the pixel electrode is in a range from about 3 μm to about 7 μm.

7. The electrophoretic display device of claim 4, wherein the pixel region is between the data line and the second cutting clearance region, the pixel electrode further comprises a third portion on the second cutting clearance region, a normal projection of the third portion onto the top surface of the first substrate does not overlap a normal projection of the common electrode onto the top surface of the first substrate.

8. The electrophoretic display device of claim 7, wherein the elongated portion of the common electrode and the third portion of the pixel electrode are spaced apart by a distance.

\* \* \* \* \*